(12) United States Patent
Bonser et al.

(10) Patent No.: US 6,365,481 B1
(45) Date of Patent: Apr. 2, 2002

(54) ISOTROPIC RESISTOR PROTECT ETCH TO AID IN RESIDUE REMOVAL

(75) Inventors: Douglas J. Bonser; Matthew Purdy, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/660,724

(22) Filed: Sep. 13, 2000

(51) Int. Cl.[7] .............................................. H01L 21/20
(52) U.S. Cl. ...................... 438/382; 438/238; 438/587; 438/723
(58) Field of Search ................................. 438/382, 381, 438/238, 587, 723

(56) References Cited

U.S. PATENT DOCUMENTS

| 5,610,099 A | * | 3/1997 | Stevens et al. ............. 438/626 |
| 6,204,105 B1 | * | 3/2001 | Jung ........................ 438/238 |
| 6,245,627 B1 | * | 6/2001 | Chen et al. ................. 438/382 |
| 6,261,916 B1 | * | 7/2001 | Re et al. ..................... 438/385 |

OTHER PUBLICATIONS

U.S. application No. 09/660,723, Bonser et al., filed Sep. 13, 2000.

* cited by examiner

*Primary Examiner*—Trung Dang
(74) *Attorney, Agent, or Firm*—Timothy M. Honeycutt

(57) ABSTRACT

Various methods of fabricating a circuit structure, such as a gate electrode or a resistor are provided. In one aspect, a method of fabricating a circuit structure is provided that includes forming a silicon structure on a substrate and forming an oxide film on the silicon structure. A first portion of the oxide film is masked while a second portion is left unmasked. The second portion of the oxide film is removed by isotropic plasma etching to expose a portion of the silicon structure, and the first portion of the oxide film is unmasked. Use of isotropic etching for removal of a resistor protect oxide reduces the potential for isolation structure damage due to aggressive overetching associated with conventional anisotropic etching techniques.

20 Claims, 3 Drawing Sheets

ISOTROPIC RESISTOR PROTECT ETCH TO AID IN RESIDUE REMOVAL

BACKGROUND OF THE INVENTION

1. Field of the Invention

This invention relates generally to semiconductor processing, and more particularly to methods of removing resistor protect films from resistor structures.

2. Description of the Related Art

Modern integrated circuits routinely contain millions of individual circuit devices. Transistors and resistors represent two of the most commonly used types of such circuit devices. Although examples of various transistor designs used in semiconductor fabrication are legion, most consist of a gate electrode and one or more impurity regions. Resistor structures are similarly fabricated in a great variety of configurations. Some are fabricated by establishing impurity regions in a semiconductor substrate. Others are fabricated by fabricating silicon or polysilicon structures and thereafter selectively doping certain portions of those structures or leaving them in an undoped state.

In some conventional semiconductor manufacturing processes, the fabrication of resistor structures and gate electrodes is integrated. For example, a polysilicon line is patterned on a substrate by blanket deposition and subsequent etching. Thereafter, certain portions of the polysilicon line are set aside for gate electrode functionality while other portions are set aside as resistor structures. The gate electrode portions will normally be provided with some concentration of impurity doping to render those portions conductive and with a refractory metal silicide film that provides enhanced ohmic contact with later formed contact plugs. The resistor structure portions of the poly line will generally be left undoped and without a silicide film.

Many modem integrated circuits implemented on a semiconductor substrate consist of a plurality of active regions generally circumscribed and defined by isolation structures. The upper surfaces of the active areas and the surrounding isolation structures are generally non-planar. Indeed, the transition from active area to isolation structure involves a step height difference. This non-planarity produces a non-planar topography for later deposited films on the active regions and the isolation structures. This non-planar topography can result in the formation of so-called "stringers" on certain portions of the upper surfaces of polysilicon lines set aside for gate electrode formation.

In some conventional fabrication processes, a polysilicon line is blanket deposited on a substrate and subsequently masked to define the general shapes of a plurality of polysilicon lines. Thereafter, an anisotropic etch is performed to define the polysilicon lines. Next, an oxide film is formed over the polysilicon lines. The oxide film serves to mask selected portions of the polysilicon line to prevent silicidation thereof so that those unsilicided portions may serve as resistor structures. To this end, the selected portions of the oxide film on the polysilicon lines are masked with photoresist and the unmasked portions of the oxide film are anisotropically etched to the underlying polysilicon lines. As a result of the uneven topography of the polysilicon lines, particularly at the steps associated with the isolation structure to active area transitions, the anisotropic etch will not completely remove the oxide material from the polysilicon lines at those steps. Those stringers left behind represent portions of the polysilicon lines that may not form silicide during subsequent salicidation processing. If left unchecked, such stringers represent areas of potential undesirably high sheet resistance as well as poor contact plug adherence.

To alleviate the problem of stringers, conventional resistor protect etching processes incorporate one or more aggressive overetching steps in order to ensure that the stringers are removed. The difficulty associated with this conventional technique is the risk that one or more aggressive overetch processes will attack the isolation structure materials, particularly at the active area to isolation structure interfaces. This unwanted attack in those areas can lead to significant device leakage.

The present invention is directed to overcoming or reducing the effects of one or more of the foregoing disadvantages.

SUMMARY OF THE INVENTION

In accordance with one aspect of the present invention, a method of fabricating a circuit structure is provided that includes forming a silicon structure on a substrate and forming an oxide film on the silicon structure. A first portion of the oxide film is masked while a second portion is left unmasked. The second portion of the oxide film is removed by isotropic plasma etching to expose a portion of the silicon structure, and the first portion of the oxide film is unmasked.

In accordance with another aspect of the present invention, a method of fabricating a resistor structure on a substrate is provided that includes forming a polysilicon structure on the substrate and forming an oxide film on the polysilicon structure. A first portion of the oxide film is masked while a second portion thereof is left unmasked. The unmasked portion of the oxide film is removed by isotropic plasma etching to expose a first portion of the polysilicon structure. A second portion of the polysilicon structure remains covered by the first portion of the oxide film and defines a resistor structure. A silicide film is formed on the first portion of the polysilicon structure. The first portion of the oxide film prevents silicide formation on the second portion of the polysilicon structure.

In accordance with another aspect of the present invention, a method of fabricating a circuit structure is provided that includes forming a polysilicon structure on a silicon substrate and forming an oxide film on the polysilicon structure. A first portion of the oxide film is masked while a second portion thereof is left unmasked. The second portion of the oxide film is removed by isotropic plasma etching to expose a portion of the polysilicon structure, and the first portion of the oxide film is unmasked.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
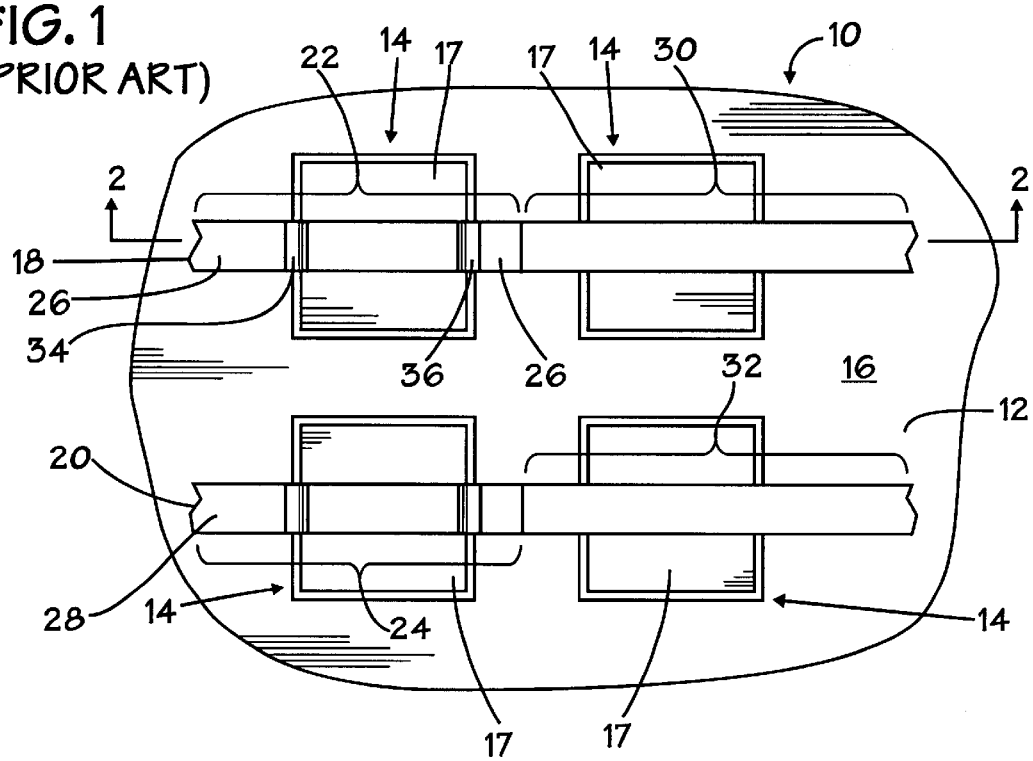
FIG. 1 is a plan view of a small portion of a conventional integrated circuit implemented on a semiconductor substrate.

In the drawings described below, reference numerals are generally repeated where identical elements appear in more than one figure. FIG. 1 depicts a plan view of a small portion of a conventional integrated circuit 10 implemented on a semiconductor substrate 12. The integrated circuit 10 includes a plurality of active areas 14 defined and separated laterally by trench isolation structures 16. Respective polysilicon conductor lines 18 and 20 are positioned over the active areas 14. Pad or gate oxide films 17 overlie the active areas 14. The respective portions 22 and 24 of the poly lines 18 and 20 have been patterned as transistor gate electrodes, and have accordingly been provided with silicide films 26 and 28. The unsilicided portions 30 and 32 of the respective poly lines 18 and 20 have been set aside as resistor structures. As described more fully below, the step height associated with the isolation structures 16 creates a non-uniform topography of the polysilicon lines 18 and 20 at the edges of the isolation structures 16. As a result of this step height, oxide stringers 34 and 36 and 38 and 40 are present on the gate electrode portions 22 and 24 of the poly lines 18 and 20. These oxide stringers 34, 36, 38 and 40 are a remnant of an oxide film that is used to prevent silicidation of the resistor device portions 30 and 32 as described more fully below.

Figure 3:
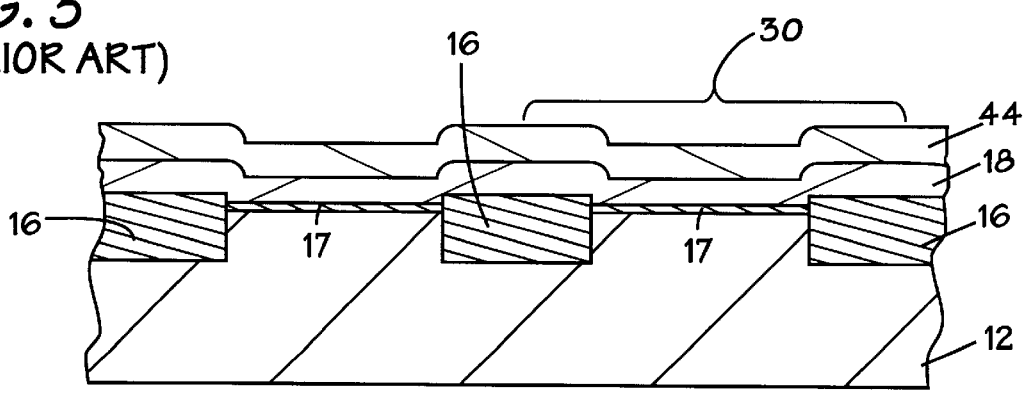
FIG. 3 is a cross-sectional view like FIG. 2 depicting formation of a silicon structure on the substrate and an oxide film on the silicon structure.
Figure 4:
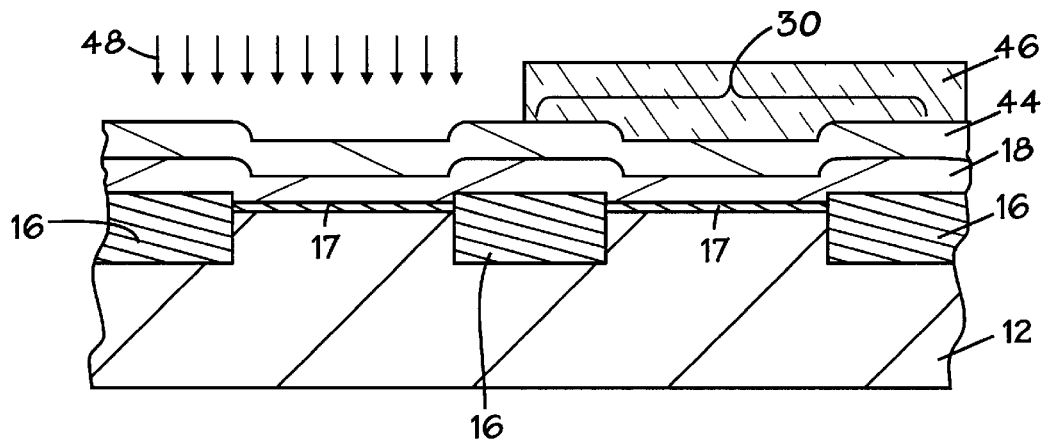
FIG. 4 is a cross-sectional view like FIG. 3 depicting masking of a portion of the oxide film and the conventional anisotropic etching of the unmasked portion.
Figure 5:
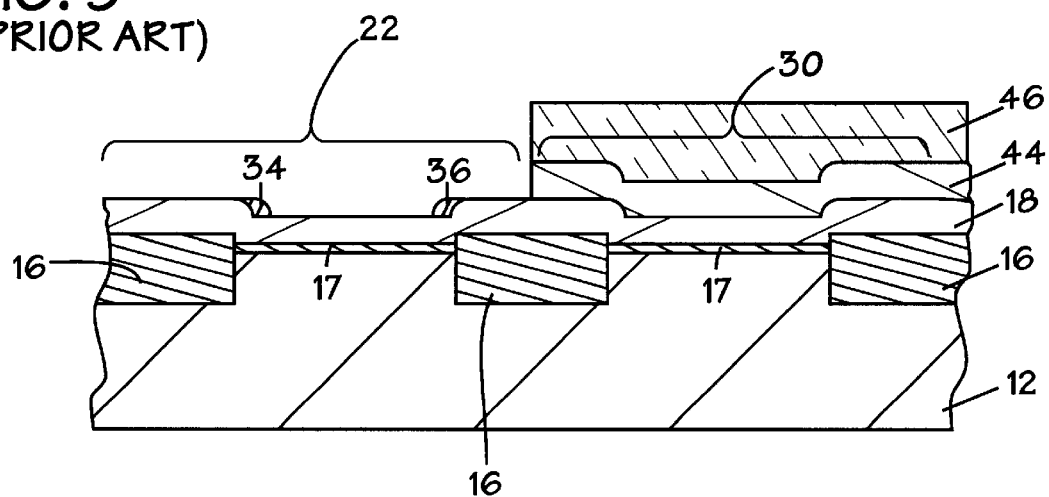
FIG. 5 is a cross-sectional view like FIG. 4 depicting the post-etch presence of oxide stringers on the silicon structure.

The conventional processing steps leading up to the formation of the stringers 34, 36, 38 and 40 may be understood by referring now to FIGS. 3, 4 and 5 and initially to FIG. 3. The description will be in the context of the poly line 18 although the description will be applicable to the other poly line 20 as well. Following fabrication of the isolation structures 16 and the pad or gate oxide films 17, the poly line 18 is established by blanket deposition of polysilicon followed by masking and anisotropic etching to define the line 18. As noted above, the lack of absolute planarity of the isolation structures 16 and the underlying substrate 12 results in a non-planar topography for the poly line 18. Following the etch definition of the poly line 18, an oxide film 44 is formed on the poly line 18. The purpose of the oxide film 44 is to prevent the subsequent silicidation of the portion 30 of the poly line 18 set aside for a resistor structure.

Referring now also to FIG. 4, the portion of the oxide film 44 underlying the portion 30 of the poly line 18 is masked with a resist structure 46 and the unmasked portion of the oxide film 44 is anisotropically etched. Note that the portion of the oxide film 44 protected by the mask structure 46 is left in place following the anisotropic etching step. This portion of the oxide film 44 will prevent the subsequent silicidation of the resistor device portion 30 of the poly line 18. In many conventional processes, reactive ion etching is used. Accordingly, the etchant ions 48 impact the oxide film 44 in a substantially perpendicular fashion. However, due to the step height over the isolation structures 16, the anisotropic etch leaves the aforementioned oxide stringers 34 and 36. These stringers 34 and 36 represent sites on the poly line 18 that will be prevented from forming silicide during later processing. While the prevention of silicide formation is intended for the resistor portion 30 of the poly line 18, complete silicidation of the gate electrode portion 22 is desired in order to achieve desirable resistivity properties for the gate electrode portion 22 and to ensure proper contact formation.

In order to ensure adequate removal of the stringers 34 and 36, many conventional fabrication processes employ one or more over etch steps to ensure complete removal. As noted above, the difficulty associated with repeated overetch steps in reactive ion or similar anisotropic etching processes is the potential for unwarranted attack of the isolation structures 16. Erosion of the upper surfaces of the isolation structures 16, particularly at the borders of active areas 14, can lead to significant device current leakage. Utilizing etch chemistry that is selective to silicon is helpful, but does not eliminate the fact that the etchant ions 48 are biased toward the substrate 12.

Figure 2:
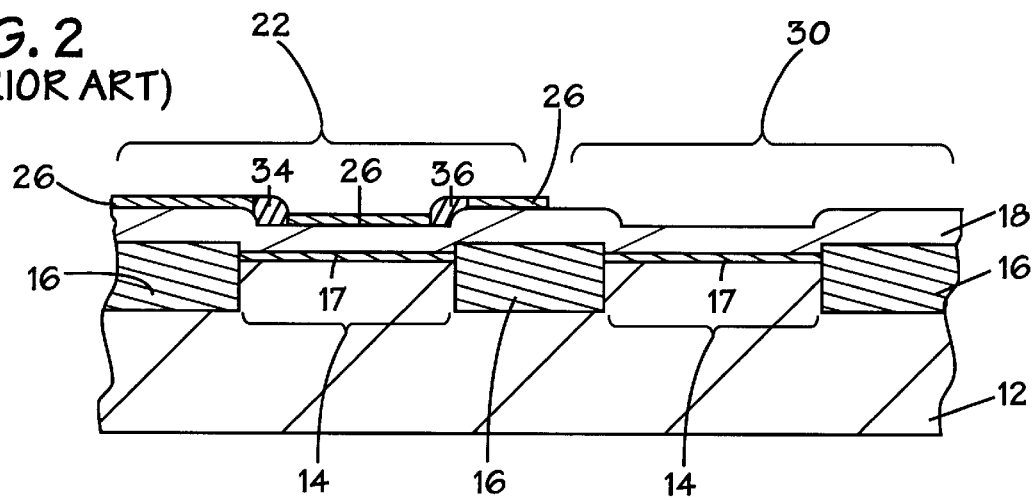
FIG. 2 is a cross-sectional view of FIG. 1 taken at section 2—2.
Figure 6:
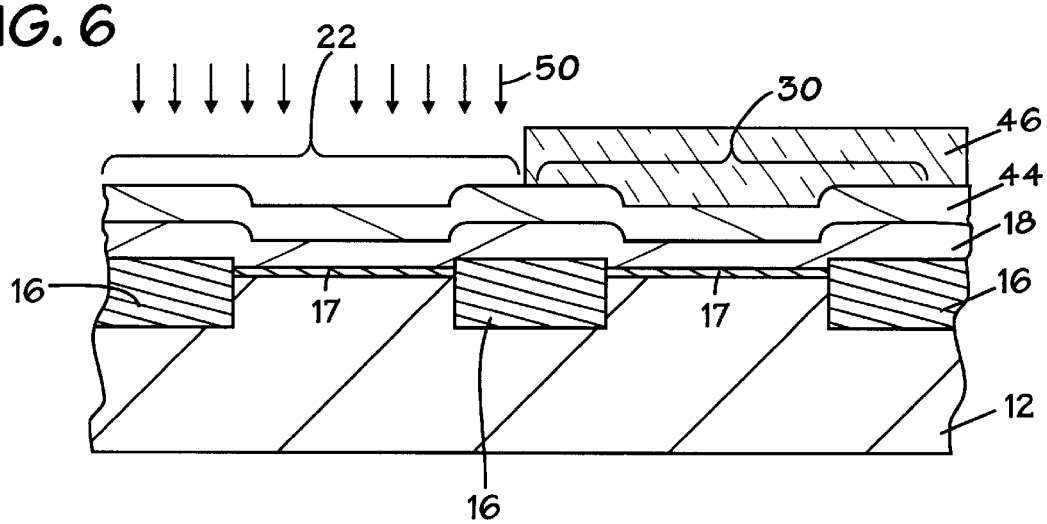
FIG. 6 is a cross-sectional view like FIG. 4 depicting etching of the unmasked portion of the oxide film using isotropic plasma etching in accordance with an exemplary embodiment of the present invention.
Figure 7:
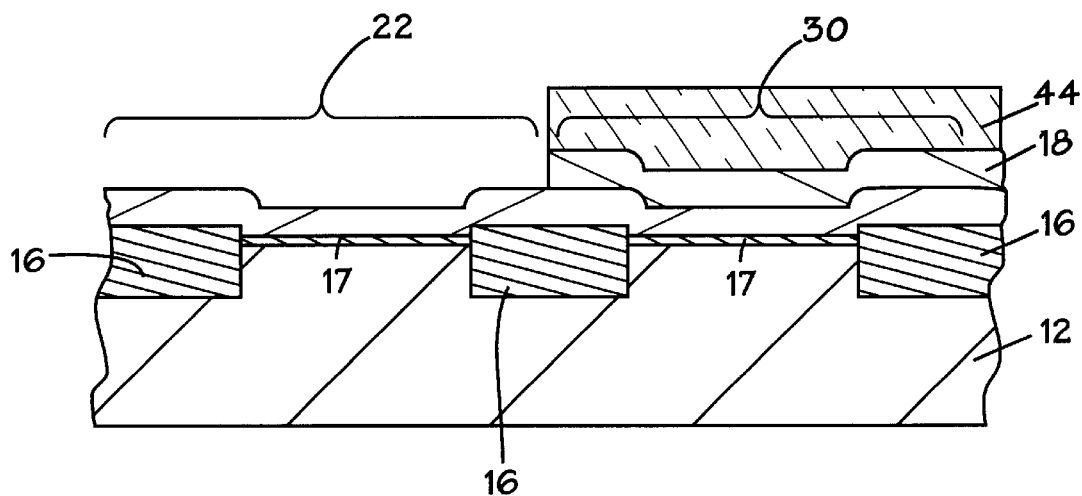
FIG. 7 is a cross-sectional view like FIG. 6 depicting a post-etch condition wherein the unmasked portion of the oxide film is removed without stringer formation in accordance with the present invention.

An exemplary method in accordance with the present invention for fabricating a circuit structure, such as a resistor structure, may be understood by referring now to FIGS. 6 and 7 and initially to FIG. 6. The substrate 12 may be processed as generally described above in conjunction with FIGS. 2, 3 and 4 up to and including the fabrication of the mask structure 46. For example, conductor line 18 may fabricated by initially depositing a layer of conducting material on the substrate 12 and subsequently defining the line 18 by reactive ion etching, chemical plasma etching or the like. The line 18 may be composed of a variety of conducting materials, such as, for example, polysilicon, amorphous silicon, aluminum, tungsten, tantalum or the like. In an exemplary embodiment, the line 18 is polysilicon. Well-known techniques for applying polysilicon, such as CVD, may be used to deposit the line 18. In an exemplary embodiment, the polysilicon is deposited at or above about 625° C. to a thickness of about 750 to 1800 Å, and advantageously to about 1300 Å. In-situ doping or later implants or diffusion steps may be used to render the line 18 conductive.

Next, the oxide film 44 is formed on the line 18, preferably by CVD, with a thickness of about 200 to 1000 Å. The mask structure 46 is then patterned on the oxide film 46 using, for example well-known photoresist application techniques. The oxide film 44 is then isotropically etched in lieu of the anisotropic etching process described above in conjunction with the conventional process. An isotropic etch will remove any stringers much more efficiently than an anisotropic etch process. The etchant ions 50 will attack the oxide film 44 in a variety of directions as shown in FIG. 6. Since the chemical attack occurs in all directions, the sidewalls of any stringers are attacked while the bulk of the oxide film 44 is removed. An overetch may still be performed, albeit with shorter durations and perhaps lower substrate bias as the more aggressive types of over etching required with anisotropic etching will not be required. A variety of etch chemistries suitable for isotropically etching oxide in a plasma ambient may be used. For example, chloro-fluoro-carbons, such as $CF_4$, $C_2F_6$ and $CHF_3$ may be used alone or in combination. In an exemplary embodiment, $CHF_3$ is used in a plasma without bias supplied to the substrate 12. Endpoint determination may be timing. Referring now to FIG. 7, the isotropic etch not only removes the bulk of the exposed portion of the oxide film 44 but also eliminates any stringers that might otherwise form if anisotropic etching were used.

Figure 8:
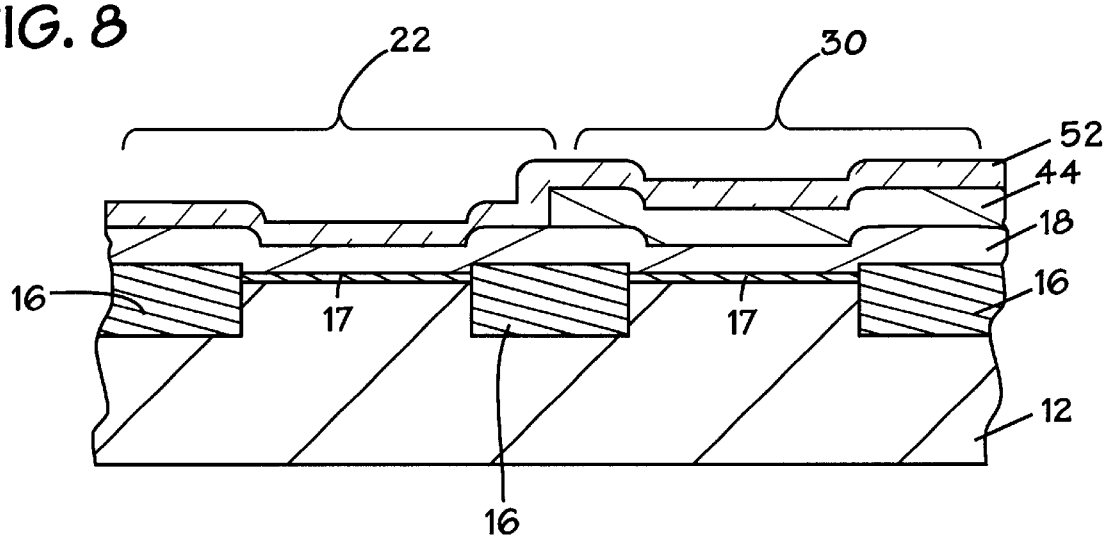
FIG. 8 is a cross-sectional view like FIG. 7 depicting silicidation of the exposed portion of the silicon structure in accordance the present invention.

Referring now to FIG. 8, the resist structure 46 shown in FIG. 7 may be stripped using well-known ashing and/or solvent techniques. Thereafter, a refractory metal film 52 may be formed on both the oxide film 42 and the exposed portion of the poly line 18 and one or two silicide forming anneals may be performed thereafter to establish a silicide film on the gate electrode portion 22 of the poly line 18. For example, titanium, cobalt, platinum, palladium, nickel, tungsten, tantalum, molybdenum, or the like may be deposited on the substrate 12 by CVD or physical vapor deposition. In an exemplary embodiment the metal is cobalt. The metal is annealed in an inert ambient at approximately 650 to 700° C. for approximately 30 to 60 seconds in a rapid thermal anneal. The inert gas may be $N_2$, argon or other suitable inert gas, and is advantageously $N_2$. The resulting silicide layer 95 may have a thickness of 250 to 500 Å and advantageously about 375 Å. The remaining portion of the oxide film 44 inhibits silicide formation on the portion 30 of the polysilicon line 18. Following the cobalt deposition, the substrate 12 may be subjected to RCA cleaning to remove any unreacted cobalt, followed by a final anneal at approximately 700 to 800° C. for approximately 30 to 60 seconds. Thereafter, the remaining portion of the oxide film 44 may be removed if desired using well-known oxide etching techniques.

The skilled artisan will appreciate that the process of the present invention provides for removal of resistor protect oxides without the need for aggressive anisotropic overetch steps and the attendant risk of excessive isolation structure erosion. The potential for device leakage at the isolation structure-active region interfaces is diminished.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a circuit structure, comprising:
   forming a silicon structure on a substrate;
   forming an oxide film on the silicon structure;
   masking a first portion of the oxide film while leaving a second portion unmasked;
   removing the second portion of the oxide film to expose a portion of the silicon structure by isotropic plasma etching; and
   unmasking the first portion of the oxide film.

2. The method of claim 1, comprising forming a silicide film on the portion of the silicon structure.

3. The method of claim 2, wherein forming of the silicide film comprises depositing cobalt and annealing the substrate to react the cobalt with silicon.

4. The method of claim 2, wherein forming of the silicide film comprises depositing cobalt or titanium and annealing the substrate to react the cobalt or titanium with silicon.

5. The method of claim 1, wherein the forming of the silicon structure comprises depositing polysilicon and patterning the polysilicon into a desired shape by etching.

6. The method of claim 1, wherein the forming of the oxide film comprises depositing oxide by chemical vapor deposition.

7. The method of claim 1, wherein the isotropic plasma etching comprises etching with $CHF_3$.

8. A method of fabricating a resistor structure on a substrate, comprising:
   forming a polysilicon structure on the substrate;
   forming an oxide film on the polysilicon structure;
   masking a first portion of the oxide film while leaving a second portion unmasked;
   removing the unmasked portion of the oxide film by isotropic plasma etching to expose a first portion of the polysilicon structure, a second portion of the polysilicon structure remaining covered by the first portion of the oxide and defining a resistor structure; and
   forming a silicide film on the first portion of the polysilicon structure, the first portion of the oxide film preventing silicide formation on the second portion of the polysilicon structure.

9. The method of claim 8, wherein forming of the silicide film comprises depositing cobalt and annealing the substrate to react the cobalt with silicon.

10. The method of claim 8, wherein forming of the silicide film comprises depositing cobalt or titanium and annealing the substrate to react the cobalt or titanium with silicon.

11. The method of claim 8, wherein the forming of the silicon structure comprises depositing polysilicon and patterning the polysilicon into a desired shape by etching.

12. The method of claim 8, wherein the forming of the oxide film comprises depositing oxide by chemical vapor deposition.

13. The method of claim 8, wherein the isotropic plasma etching comprises etching with $CHF_3$.

14. A method of fabricating a circuit structure, comprising:
   forming a polysilicon structure on a silicon substrate;
   forming an oxide film on the polysilicon structure;
   masking a first portion of the oxide film while leaving a second portion unmasked;
   removing the second portion of the oxide film to expose a portion of the polysilicon structure by isotropic plasma etching; and
   unmasking the first portion of the oxide film.

15. The method of claim 14, comprising forming a silicide film on the portion of the polysilicon structure.

16. The method of claim 15, wherein forming of the silicide film comprises depositing cobalt and annealing the substrate to react the cobalt with silicon.

17. The method of claim 15, wherein forming of the silicide film comprises depositing cobalt or titanium and annealing the substrate to react the cobalt or titanium with silicon.

18. The method of claim 14, wherein the forming of the silicon structure comprises depositing polysilicon and patterning the polysilicon into a desired shape by etching.

19. The method of claim 14, wherein the forming of the oxide film comprises depositing oxide by chemical vapor deposition.

20. The method of claim 14, wherein the isotropic plasma etching comprises etching with $CHF_3$.

* * * * *

UNITED STATES PATENT AND TRADEMARK OFFICE
CERTIFICATE OF CORRECTION

PATENT NO. : 6,365,481 B1
DATED : April 2, 2002
INVENTOR(S) : Douglas J. Bonser et al.

It is certified that error appears in the above-identified patent and that said Letters Patent is hereby corrected as shown below:

<u>Column 1,</u>
Line 35, delete "modem" and substitute -- modern -- therefor.

<u>Column 6,</u>
Line 42, delete "isotopic" and substitute -- isotropic -- therefor.

Signed and Sealed this

Seventeenth Day of September, 2002

*Attest:*

JAMES E. ROGAN
*Director of the United States Patent and Trademark Office*

*Attesting Officer*